(12) United States Patent
Zhu et al.

(10) Patent No.: US 12,426,448 B2
(45) Date of Patent: Sep. 23, 2025

(54) DISPLAY MODULE AND MANUFACTURING METHOD OF DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventors: Cuilin Zhu, Hubei (CN); Yuelong Song, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 820 days.

(21) Appl. No.: 17/622,826

(22) PCT Filed: Dec. 14, 2021

(86) PCT No.: PCT/CN2021/138031
§ 371 (c)(1),
(2) Date: Dec. 26, 2021

(87) PCT Pub. No.: WO2023/092724
PCT Pub. Date: Jun. 1, 2023

(65) Prior Publication Data
US 2023/0165045 A1    May 25, 2023

(30) Foreign Application Priority Data
Nov. 24, 2021 (CN) .......................... 202111398768.5

(51) Int. Cl.
*H01L 51/52* (2006.01)
*H01L 51/56* (2006.01)
(Continued)

(52) U.S. Cl.
CPC ......... *H10K 59/124* (2023.02); *H10K 50/868* (2023.02); *H10K 50/87* (2023.02);
(Continued)

(58) Field of Classification Search
CPC .............................. H10K 59/60; H10K 59/65
See application file for complete search history.

(56) References Cited

U.S. PATENT DOCUMENTS

2020/0117034 A1* 4/2020 Yin .................. G02F 1/133528
2021/0083023 A1* 3/2021 Zheng ................... H10K 59/65
(Continued)

FOREIGN PATENT DOCUMENTS

CN    107946341 A    4/2018
CN    108885376 A    11/2018
(Continued)

OTHER PUBLICATIONS

Machine translation, Lin, Chinese Pat. Pub. No. CN110208976A, translation date: Jun. 19, 2024; Espacenet, all pages (Year: 2024).*
(Continued)

*Primary Examiner* — Victoria K. Hall
(74) *Attorney, Agent, or Firm* — Rivka Friedman

(57) ABSTRACT

The present application discloses a display module and a manufacturing method of the display module. The display module includes a display panel, an optical film disposed on a light-emitting side of the display panel, a functional layer disposed on a non-light-emitting side of the display panel, and a photosensitive element disposed on the functional layer, the display panel has a continuous structure, and each of the film layers of the display panel is provided with a light-transmitting non-display region, which effectively improves the "gourd screen" phenomenon.

18 Claims, 8 Drawing Sheets

(51) Int. Cl.
    *H10K 50/80*         (2023.01)
    *H10K 50/87*         (2023.01)
    *H10K 59/121*       (2023.01)
    *H10K 59/124*       (2023.01)
    *H10K 59/80*         (2023.01)
    *H10K 71/00*         (2023.01)
    *H10K 59/12*         (2023.01)
    *H10K 59/122*       (2023.01)
    *H10K 59/40*         (2023.01)
    *H10K 59/65*         (2023.01)

(52) U.S. Cl.
    CPC ....... *H10K 59/121* (2023.02); *H10K 59/8791* (2023.02); *H10K 71/00* (2023.02); *H10K 59/1201* (2023.02); *H10K 59/122* (2023.02); *H10K 59/40* (2023.02); *H10K 59/65* (2023.02)

(56) References Cited

U.S. PATENT DOCUMENTS

| | | | |
|---|---|---|---|
| 2021/0098556 A1* | 4/2021 | Jang | H10K 59/123 |
| 2021/0296404 A1* | 9/2021 | You | H10K 59/8792 |
| 2021/0335930 A1* | 10/2021 | Zheng | H10K 59/8731 |
| 2021/0359051 A1* | 11/2021 | Jin | H10K 50/84 |
| 2022/0085326 A1* | 3/2022 | Chai | H10K 59/8791 |
| 2022/0165986 A1 | 5/2022 | Wang | |
| 2022/0310768 A1* | 9/2022 | Long | H10K 59/121 |
| 2023/0006183 A1* | 1/2023 | Rhe | G06F 3/0412 |
| 2023/0329070 A1* | 10/2023 | Long | H10K 77/111 |
| | | | 257/40 |

FOREIGN PATENT DOCUMENTS

| | | | | |
|---|---|---|---|---|
| CN | 110034152 A | | 7/2019 | |
| CN | 110208976 A | * | 9/2019 | ........... G02F 1/1333 |
| CN | 110211972 A | | 9/2019 | |
| CN | 111863868 A | | 10/2020 | |
| CN | 112086025 A | | 12/2020 | |
| CN | 112289185 A | | 1/2021 | |
| CN | 112531127 A | | 3/2021 | |
| CN | 112635535 A | | 4/2021 | |
| CN | 112820767 A | | 5/2021 | |
| CN | 214042890 U | | 8/2021 | |

OTHER PUBLICATIONS

Written Opinion of International Searching Authority, International Searching Authority, International application No. PCT/CN2021/138031, Aug. 29, 2022, all pages. (Year: 2022).*

International Search Report, International Searching Authority, International application No. PCT/CN2021/138031, Aug. 29, 2022, all pages. (Year: 2022).*

* cited by examiner

| providing a display panel including a substrate and a plurality of film layers stacked on the substrate, each of the plurality of film layers is provided with a light-transmitting non-display region, and positions of the light-transmitting non-display regions of the respective film layers correspond to each other | S1 |

↓

| forming an optical film on a light-emitting side of the display panel, and forming a first through hole in the optical film, a position of the first through hole corresponds to the light-transmitting non-display region, and a forward projection of the first through hole on the display panel falls within a range of the light-transmitting non-display region | S2 |

↓

| forming a functional layer including a photosensitive element mounting layer on a non-light-emitting side of a display panel, and forming a second through hole in the photosensitive element mounting layer, a position of the second through hole corresponds to the first through hole, and a forward projection of the second through hole on the display panel falls within a range of the forward projection of the first through hole on the display panel | S3 |

↓

| providing a photosensitive element, and mounting the photosensitive element to the second through hole | S4 |

FIG. 13 providing a stacked structure including a substrate and a plurality of film layers stacked on the substrate, each of the plurality of film layers is predefined with a light-transmitting non-display region, and positions of the predefined light-transmitting non-display regions of respective film layers correspond to each other — S10 using an etching process to remove a film material in a predefined light-transmitting non-display region in each of the film layers to obtain a stacked structure having a hollowed-out region — S20 filling the hollowed-out region in the step S20 with a light-transmitting material having a light transmittance of 90% or more, and then drying to obtain a display panel — S30 forming an optical film on a light-emitting side of a display panel filled with the light-transmitting material, and forming a first through hole in the optical film, a position of the first through hole corresponds to the light-transmitting non-display region, and a forward projection of the first through hole on the display panel falls within a range of the light-transmitting non-display region — S40 forming a functional layer including a photosensitive element mounting layer on the non-light-emitting side of a display panel filled with a light-transmitting material, and forming a second through hole in the photosensitive element mounting layer, a position of the second through hole corresponds to the first through hole, and the forward projection of the second through hole on the display panel falls within a range of the forward projection of the first through hole on the display panel — S50 providing a photosensitive element, and mounting the photosensitive element to the second through hole — S60

FIG. 14

DISPLAY MODULE AND MANUFACTURING METHOD OF DISPLAY MODULE

FIELD OF INVENTION

The present application relates to a display technology field, in particular to a display module and a manufacturing method of the display module.

BACKGROUND OF INVENTION

In recent years, high screen-to-body ratio display technology has become a research hotspot in the display technology field. Under the same screen size, a display module having a high screen-to-body ratio characteristic has a wider display area than a conventional display module, which is advantageous for improving a user experience. In order to achieve the high screen-to-body ratio, a preset avoidance space (or void space) is usually required to meet requirements of some functional elements. The functional element may be, for example, a camera, an earpiece, a fingerprint recognition sensor, a face recognition sensor, or the like. These functional elements may be disposed on a non-light-emitting side of the display module, and through holes are defined at positions of a display panel of the display module corresponding to these functional elements to form avoidance spaces.

SUMMARY OF INVENTION

Technical Problem

In the prior art, a laser cutting process is generally used to cut a display module integrally to form a through hole. Because the integration cutting relates to a large number of film layers and a large number of regions are affected by the cutting, it is easy to generate a cutting crack. The edge crack generated by the cutting may extend to the display region and cause a problem of poor display, and may affect the aesthetics of the final product, such as a "gourd screen" phenomenon. As shown in FIG. 1, an approximately circular black spot region 30 is formed near a through hole 20 (e.g., a through hole for installing the camera) of a display module 10. The through hole 20 and the black spot region 30 are connected to form a gourd-like shape, so it is called the "gourd screen" phenomenon.

Further, for a display module including a flexible organic light-emitting diode (OLED) display panel, a method of integrally cutting the display module to form a through hole using a laser cutting process has limitations. Since it is generally necessary to perform thin film encapsulation (TFE) on flexible OLED display panel, after cutting and defining opening (or hole) in the display module including the flexible OLED display panel, the display reliability at an edge of the opening cannot be ensured. Therefore, it is usually necessary to add an encapsulation structure to the edge of the opening, and thus, the manufacturing difficulty of the display module is increased, the production cost is increased, and the user experience is poor.

Technical Solution

In view of the disadvantages of the prior art, the present application provides a display module and a manufacturing method of the display module to improve the "gourd screen" phenomenon.

According to a first aspect, the present application provides a display module comprising:
a display panel comprising a substrate and an array substrate stacked on the substrate;
an optical film disposed on a light-emitting side of the display panel, wherein the optical film is provided with a first through hole, and ambient light enters the display module through the first through hole;
a functional layer disposed on a non-light-emitting side of the display panel, wherein the functional layer comprises a photosensitive element mounting layer, the photosensitive element mounting layer is provided with a second through hole, a position of the second through hole corresponds to the first through hole; and
a photosensitive member mounted to the second through hole,
wherein the display panel has a continuous structure, the array substrate is provided with light-transmitting non-display regions, the positions of the light-transmitting non-display regions of respective film layers correspond to each other and correspond to the first through hole and the second through hole, and a forward projection of the first through hole on the display panel falls within a range of the light-transmitting non-display region, and a forward projection of the second through hole on the display panel falls within a range of the forward projection of the first through hole on the display panel.

In some embodiments of the present application, the display module further comprises an optical pad disposed in the first through hole, a side of the optical pad away from the display panel is aligned with a side of the optical film away from the display panel, and a material of the optical pad is a light-transmitting material having a light transmittance greater than or equal to 90%.

In some embodiments of the present application, a material of the light-transmitting non-display region in each of the film layers is same as at least one material in the same film layer in display region, and a light transmittance of the at least one material is greater than or equal to 90%.

In some embodiments of the present application, the display module comprises an array substrate, an organic light emitting layer, an encapsulation layer, and a touch layer which are sequentially stacked, wherein the array substrate is provided with a first light-transmitting non-display region, and a material of the first light-transmitting non-display region is same as a light-transmitting material in the array substrate; the organic light emitting layer is provided with a second light-transmitting non-display region, a material of the second light-transmitting non-display region is same as a light-transmitting material in the organic light emitting layer; the encapsulation layer is provided with a third light-transmitting non-display region, a material of the third light-transmitting non-display region is same as a material in the encapsulation layer; the touch layer is provided with a fourth light-transmitting non-display region, a material of the fourth light-transmitting non-display region is same as a light-transmitting material in the touch layer.

In some embodiments of the present application, the first light-transmitting non-display region comprises a pixel defining layer and a planarizing layer; the second light-transmitting non-display region comprises a stacked structure other than a color filter layer; the fourth light-transmitting non-display region comprises an insulating layer other than a touch wire.

In some embodiments of the present application, materials of the light-transmitting non-display regions of the respective film layers are the same light-transmitting material, and a light transmittance of the light-transmitting material is greater than or equal to 90%.

In some embodiments of the present application, the display panel is an organic light emitting diode display panel, and the corresponding optical film is a polarizer.

In some embodiments of the present application, a difference between a diameter of the first through hole and a diameter of the second through hole is greater than or equal to 0.2 mm.

In some embodiments of the present application, the functional layer further comprises a heat dissipation buffer layer, the heat dissipation buffer layer is disposed between the non-light-emitting side of the display panel and the photosensitive element mounting layer, the heat dissipation buffer layer is provided with a third through hole, a position of the third through hole corresponds to the first through hole and the second through hole, and the forward projection of the second through hole on the display panel falls within a range of a forward projection of the third through hole on the display panel.

In some embodiments of the present application, a difference between a diameter of the third through hole and a diameter of the second through hole is greater than or equal to 0.6 mm.

In some embodiments of the present application, the functional layer further comprises a support layer, the support layer is disposed between a non-light-emitting side of the display panel and the photosensitive element mounting layer; the support layer has a continuous structure, and a material of the support layer is a light-transmitting material having a light transmittance greater than or equal to 90%.

In some embodiments of the present application, the functional layer further comprises a support layer, the support layer is disposed between a non-light-emitting side of the display panel and the photosensitive element mounting layer; the support layer is provided with a fourth through hole, a position of the fourth through hole corresponds to the first through hole and the second through hole, and the forward projection of the second through hole on the display panel falls within a range of a forward projection of the fourth through hole on the display panel.

In some embodiments of the present application, a difference between a diameter of the fourth through hole and a diameter of the second through hole is greater than or equal to 0.2 mm.

In some embodiments of the present application, the display module further comprises an optical clear adhesive layer, the optical clear adhesive layer is disposed on at least one side of the optical film, and the optical clear adhesive layer has a continuous structure.

In some embodiments of the present application, the display module further comprises an optical clear adhesive layer, the optical clear adhesive layer is disposed on at least one side of the optical film, and the optical clear adhesive layer is provided with a fifth through hole, a position of the fifth through hole corresponds to the first through hole and the second through hole, and the forward projection of the second through hole on the display panel falls within a range of a forward projection of the fifth through hole on the display panel.

In some embodiments of the present application, a difference between a diameter of the fifth through hole and a diameter of the second through hole is greater than or equal to 0.3 mm.

According to a second aspect, the present application provides a manufacturing method of a display module, the manufacturing method of the display module comprising following steps:
providing a display panel comprising a substrate and a plurality of film layers stacked on the substrate, wherein each of the plurality of film layers is provided with a light-transmitting non-display region, and positions of the light-transmitting non-display regions of the respective film layers correspond to each other;
forming an optical film on a light-emitting side of the display panel, and forming a first through hole in the optical film, wherein a position of the first through hole corresponds to the light-transmitting non-display area, and a forward projection of the first through hole on the display panel falls within a range of the light-transmitting non-display area;
forming a functional layer on a non-light-emitting side of the display panel, the functional layer comprising a photosensitive element mounting layer, and forming a second through hole in the photosensitive element mounting layer, wherein a position of the second through hole corresponds to the first through hole, and a forward projection of the second through hole on the display panel falls within a range of the forward projection of the first through hole on the display panel; and
providing a photosensitive element mounted to the second through hole.

In some embodiments of the present application, the step of providing the display panel comprising the substrate and the plurality of film layers stacked on the substrate, wherein each of the plurality of film layers is provided with the light-transmitting non-display region, and positions of the light-transmitting non-display regions of the respective film layers correspond to each other, comprises following steps:
providing a stacked structure comprising a substrate and a plurality of film layers stacked on the substrate, wherein each of the plurality of film layers is predefined with a light-transmitting non-display region, and positions of the predefined light-transmitting non-display regions of the respective film layers corresponds to each other;
removing film materials in the predefined light-transmitting non-display regions in the respective film layers using an etching process to obtain a stacked structure having a hollowed-out region; and
filling the hollowed-out region with a light-transmitting material having a light transmittance greater than or equal to 90%, and then drying to obtain the display panel.

In some embodiments of the present application, the step of providing the display panel comprising the substrate and the plurality of film layers stacked on the substrate, wherein each of the plurality of film layers is provided with the light-transmitting non-display region, and positions of the light-transmitting non-display regions of the respective film layers correspond to each other, comprises following steps:
when each of functional film layers is formed separately, a light-transmitting non-display area is defined on each of the functional film layers in advance, and non-light-transmitting functional patterns on corresponding functional film layers are disposed away from the light-transmitting non-display regions, and a light-transmitting non-display region of the display module is formed by stacking the light-transmitting non-display regions of the respective functional film layers.

In some embodiments of the present application, the step of providing the display panel comprising the substrate and the plurality of film layers stacked on the substrate, wherein each of the plurality of film layers is provided with the light-transmitting non-display region, and positions of the light-transmitting non-display regions of the respective film layers correspond to each other, comprises following steps:

when each of functional film layers is formed separately, some of the film layers are provided with the light-transmitting non-display regions by forming holes and filling the holes with a light-transmitting material, some of the film layers are provided with the light-transmitting non-display regions by arranging the non-light-transmitting functional patterns away from the light-transmitting non-display regions, and a light-transmitting non-display region of the display module is formed by stacking the light-transmitting non-display regions of the respective functional film layers.

Advantageous Effects

The present application provides a display module including a display panel, an optical film disposed on a light-emitting side of the display panel, a functional layer disposed on a non-light-emitting side of the display panel, and a photosensitive element disposed on the functional layer. The display panel has a continuous structure, and each of film layers in the display panel is provided with a light-transmitting non-display region. The optical film is provided with a first through hole, the photosensitive element mounting layer in the functional layer is provided with a second through hole serving as a mounting structure of the photosensitive element, and the positions of the first through hole, the second through hole, and the light-transmitting non-display regions of respective film layers in the display panel correspond to each other. Since the display panel is not provided with the through hole, the display panel has a strong compression resistance, so that cracks are not easily generated under compression, and the "gourd screen" phenomenon is effectively improved.

Preferably, an optical pad is fitted in the first through hole, and the material of the optical pad is a light-transmitting material having a light transmittance of 90% or more to balance the step between the optical film and the display panel, thereby preventing air bubbles from being generated at the step between the optical film and the display panel.

The present application further provides a manufacturing method of a display module. First, a light-transmitting non-display region of each of film layers in a display panel is prepared, and then the display panel, an optical film and a photosensitive element are assembled into the display module. Compared with a conventional manufacturing method of a display module, a mode in which a display module is formed by assembling and then the display module is integrally cut, so that a through hole is formed in the display panel, the optical film and a functional layer, is changed, and the through hole is not provided in the display panel. The "gourd screen" phenomenon is effectively improved under the premise of ensuring that the photosensitive element fully captures the ambient light, which is beneficial to aesthetics of the display module.

DESCRIPTION OF DRAWINGS

FIG. 13 is a schematic flow chart of a manufacturing method of a display module according to an embodiment of the present application.

FIG. 14 is a schematic flow chart of another manufacturing method of a display module according to an embodiment of the present application.

DETAILED DESCRIPTION OF EMBODIMENTS

Figure 1:
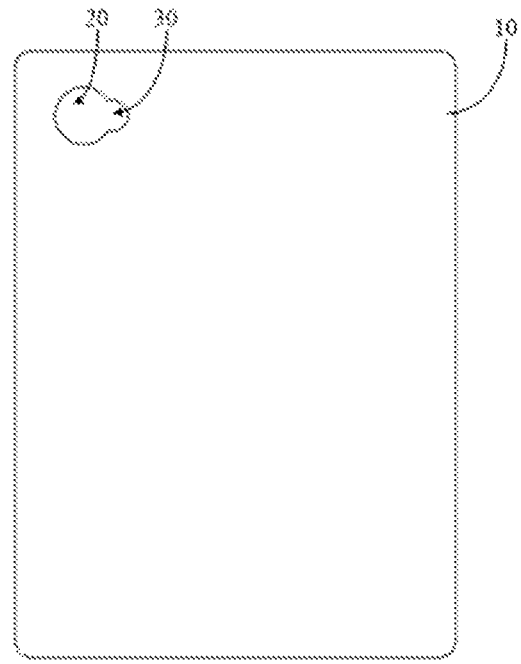
FIG. 1 is a schematic structural diagram of a display module in which a "gourd screen" phenomenon is exhibited in the prior art.

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application.

In the description of the present disclosure, orientations or position relationships indicated by the terms "upper", "side" and the like, are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure.

In the description of the present disclosure, the term "first", "second" and the like, are for illustrative purposes only and are not to be construed as indicating or imposing a relative importance or implicitly indicating the number of technical features indicated. Thus, a feature that limited by "first", "second" may expressly or implicitly include one or more of the features.

In the description of the present disclosure, the meaning of "plural" is two or more, unless otherwise specifically defined.

In the description of the present application, "fall in (within or into)" includes a situation of completely overlapping, for example, "the forward projection of the second through hole on the display panel falls within the range of the forward projection of the first through hole on the display panel" includes following situations: (1) the forward projection of the second through hole on the display panel completely overlaps the forward projection of the first through hole on the display panel; (2) an area of the forward projection of the first through hole on the display panel is greater than an area of the front projection of the second through hole on the display panel.

Figure 2:
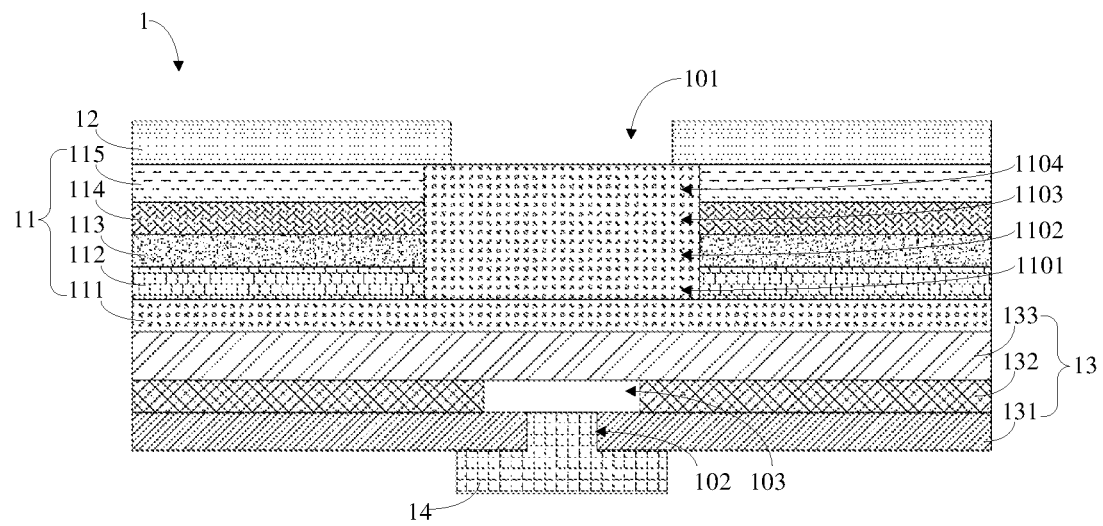
FIG. 2 is a schematic structural diagram of a display module according to an embodiment of the present application.

The present application provides a display module, as shown in FIG. 2, a display module 1 includes a display panel 11, an optical film (or optical film sheet) 12, a functional layer 13, and a photosensitive element 14. The optical film 12 is disposed on a light-emitting side of the display panel 11, the functional layer 13 is disposed on a non-light-emitting side of the display panel 11, and the photosensitive element 14 is mounted on the functional layer 13.

The display panel 11 may be an OLED display panel, a quantum dot display panel, a liquid crystal display panel, or the like. The display panel 11 may be rigid or flexible. The type of the display panel 11 is not specifically limited, and only a continuous structure of the display panel 11 is required, that is, the display panel 11 is not provided with a through hole through the entire display panel 11, so that the display panel 11 has no hollowed-out area.

In some embodiments of the present application, the display panel 11 is a flexible OLED display panel, continuing to refer to FIG. 2, the display panel 11 includes a substrate 111, and an array substrate 112, an organic light emitting layer 113, an encapsulation layer 114, and a touch layer 115 disposed on the substrate 111.

The material of the substrate 111 may be at least one of polyimide (PI), polyethersulfone (PES), polycarbonate (PC), polyethylene terephthalate (PET), polyethylene naphthalate (PEN), polyarylate (PAR), and fibreglass reinforced plastics (FRP). Preferably, the material of the substrate 111 is a light-transmitting material having a light transmittance greater than or equal to 90%, and as an example, the material of the substrate 111 is polyimide.

The array substrate 112 may be a thin film transistor (TFT) array substrate, and the TFT array substrate may be a top gate structure or a bottom gate structure. As an example, the array substrate 112 is a top gate type TFT array substrate.

The organic light emitting layer 113 may be a positive type structure including an anode, a hole transport layer, an organic light emitting layer, an electron transport layer, and a cathode, which are disposed sequentially; the organic light emitting layer 113 may also be a negative structure including a cathode, an electron transport layer, an organic light emitting layer, a hole transport layer, and an anode, which are disposed sequentially. As an example, the organic light emitting layer 113 has the positive structure.

The encapsulation layer 114 may be a single layer structure or a stacked structure. As an example, the encapsulation layer 114 is a stacked structure formed by alternately disposing inorganic material layers and organic material layers.

The touch layer 115 has a stacked structure. As an example, the touch layer 115 is a capacitive touch structure.

The array substrate 112, the organic light emitting layer 113, the encapsulation layer 114, and the touch layer 115 are each provided with a light-transmitting non-display region, and positions of the light-transmitting non-display region of the array substrate 112, the light-transmitting non-display region of the organic light emitting layer 113, the light-transmitting non-display region of the encapsulation layer 114, and the light-transmitting non-display region of the touch layer 115 correspond to each other.

In some embodiments of the present application, continuing to refer to FIG. 2, the array substrate 112 is provided with a first light-transmitting non-display region 1101, the organic light emitting layer 113 is provided with a second light-transmitting non-display region 1102, the encapsulation layer 114 is provided with a third light-transmitting non-display region 1103, the touch layer 115 is provided with a fourth light-transmitting non-display region 1104, the respective forward projections of the first light-transmitting non-display region 1101, the second light-transmitting non-display region 1102, the third light-transmitting non-display region 1103, and the fourth light-transmitting non-display region 1104 on the substrate 111 are completely overlapped with each other, and the first light-transmitting non-display region 1101, the second light-transmitting non-display region 1102, the third light-transmitting non-display region 1103, and the fourth light-transmitting non-display region 1104 are an integrated structure. The materials of the first light-transmitting non-display region 1101, the second light-transmitting non-display region 1102, the third light-transmitting non-display region 1103, and the fourth light-transmitting non-display region 1104 are all the same light-transmitting material having a light transmittance greater than or equal to 90%, and as an example, the light-transmitting material is polyimide.

Figure 3:
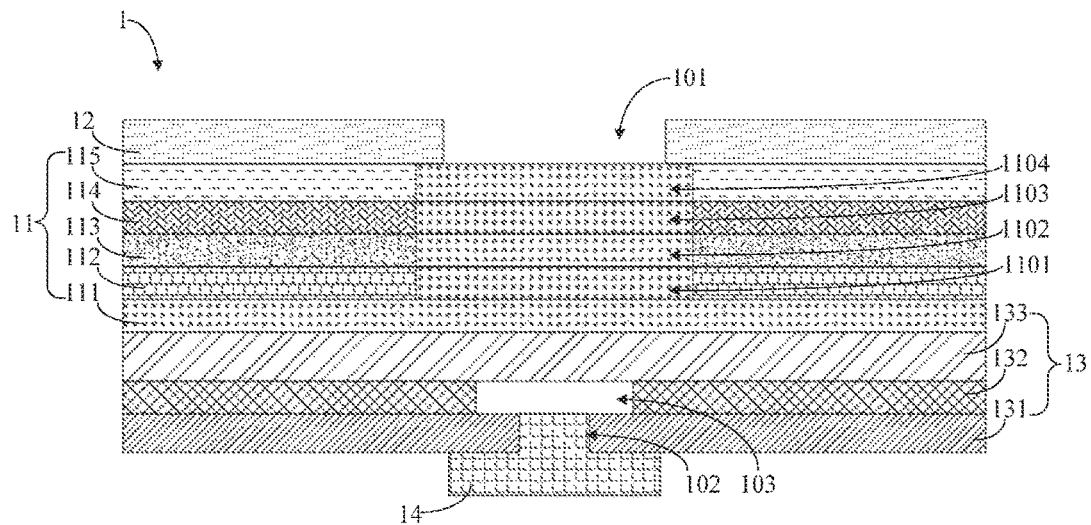
FIG. 3 is a schematic structural diagram of another display module according to an embodiment of the present application.

In another embodiments of the present application, as shown in FIG. 3, the array substrate 112 is provided with the first light-transmitting non-display region 1101, the organic light emitting layer 113 is provided with the second light-transmitting non-display region 1102, the encapsulation layer 114 is provided with the third light-transmitting non-display region 1103, the touch layer 115 is provided with the fourth light-transmitting non-display region 1104, the first light-transmitting non-display region 1101, the second light-transmitting non-display region 1102, the third light-transmitting non-display region 1103, and the fourth light-transmitting non-display region 1104 are independent of each other, and the respective forward projections of the first light-transmitting non-display region 1101, the second light-transmitting non-display region 1102, the third light-transmitting non-display region 1103, and the fourth light-transmitting non-display region 1104 on the substrate 111 are at least partially overlapped with each other, for example, completely overlapped with each other. The materials of the first light-transmitting non-display region 1101, the second light-transmitting non-display region 1102, the third light-transmitting non-display region 1103, and the fourth light-transmitting non-display region 1104 may be same as each other, may be different from each other, or may be partially same, and only the light transmittance of the materials of the first light-transmitting non-display region 1101, the second light-transmitting non-display region 1102, the third light-transmitting non-display region 1103, and the fourth light-transmitting non-display region 1104 needs to be greater than or equal to 90%.

Further, among the first light-transmitting non-display region 1101, the second light-transmitting non-display region 1102, the third light-transmitting non-display region 1103, and the fourth light-transmitting non-display region 1104, the material of each light-transmitting non-display region is same as at least one of the materials of the display area in the same film layer, the light transmittance of the at least one material is equal to or greater than 90%, and the non-light-transmitting (or opaque) function pattern on the corresponding functional film layer is disposed away from the light-transmitting non-display region, so as to constitute the display region and the light-transmitting non-display region. Continuing to refer to FIG. 3, the material of the first light-transmitting non-display region 1101 is same as a light-transmitting material in the array substrate 112, the material of the second light-transmitting non-display region 1102 is same as a light-transmitting material in the organic light emitting layer 113, the material of the third light-transmitting non-display region 1103 is same as a material of the encapsulation layer 114, and the material of the fourth light-transmitting non-display region 1104 is same as a light-transmitting material in the touch layer 115. Specifically, the first light-transmitting non-display region 1101 in the same film layer as the array substrate 112 includes the material of a pixel defining layer and a planarizing layer, the second light-transmitting non-display region 1102 in the same film layer as the organic light emitting layer 113 includes the basic device structure of the OLED other than the color filter layer, a hole may be formed in the cathode layer of the OLED in the second light-transmitting non-display region 1102 and filled with the light-transmitting material, or the entire cathode layer is made of a new cathode material having a transparency of more than 90%, the material of the third light-transmitting non-display region 1103 in the same film layer as the encapsulation layer 114 coincides with the organic/inorganic stacked material of the encapsulation layer 114, and the fourth light-transmitting non-display region 1104 in the same film layer as the touch layer 115 includes the insulating layer other than the touch wires; it should be noted that the foregoing manner of forming the light-transmitting non-display region in each functional film layer is not limited to the non-transmitting functional pattern avoidance design, and the light-transmitting non-display region in each functional film layer may be realized by forming holes and filling a light-transmitting material after completion of a single functional film layer.

Continuing to refer to FIGS. 2 and 3, the optical film 12 is a polarizer having an anti-reflection effect to prevent ambient light from negatively affecting the display effect of the display panel 11. The optical film 12 is provided with a first through hole 101 through which ambient light enters the display panel 11 and is captured by the photosensitive element 14. The reason why the optical film 12 is not provided on an entire surface is that the optical film 12 has a low light transmittance, and if the first through hole 101 is not provided, the throughput of the ambient light is greatly reduced, thereby affecting the operation performance of the photosensitive element 14.

The functional layer 13 is provided on the non-light-emitting side of the display panel 11. The functional layer 13 includes a photosensitive element mounting layer 131 which may be, for example, a housing of the display panel 11. The photosensitive element mounting layer 131 is provided with a second through hole 102 which may serve as a structure for mounting the photosensitive element 14. The position of the second through hole 102 corresponds to the first through hole 101, and the forward projection of the second through hole 102 on the display panel 11 falls within the range of the forward projection of the first through hole 101 on the display panel 11, so that the photosensitive element 14 fully captures the ambient light transmitted from the first through hole 101.

In some embodiments of the present application, the photosensitive element 14 is a camera.

In some embodiments of the present application, a diameter of the first through hole 101 is greater than a diameter of the second through hole 102, and the difference between the diameter of the first through hole 101 and the diameter of the second through hole 102 is 0.2 mm or more. Under the premise of ensuring that the photosensitive element 14 fully captures the ambient light transmitted from the first through hole 101, light leakage is avoided, and interference with the photosensitive element 14 is prevented.

It should be noted that in a conventional display module having a high screen-to-body ratio characteristic, the display panel has a discontinuous structure, that is, the display panel is provided with a through hole through the entire display panel, so that the display panel has a hollowed area, and therefore, a "gourd screen" phenomenon is prone to appear. In the display module of the embodiments of the present application, the display panel has a continuous and uninterrupted structure, which effectively avoids the phenomenon of "gourd screen".

Since the optical film 12 is provided with the first through hole 101 and the display panel 11 is not provided with the through hole, there is a step between the optical film 12 and the display panel 11. When the protective cover is attached on the side of the optical film 12 away from the display panel 11, air bubbles are easily generated at the step between the optical film 12 and the display panel 11, thereby negatively affecting the operating performance of the display module 1.

In order to prevent air bubbles from being generated at the step between the optical film 12 and the display panel 11, the display module 1 further includes an optical pad adapted to be disposed in the first through hole 101, and a side of the optical pad away from the display panel 11 is aligned with the side of the optical film 12 away from the display panel 11, and the material of the optical pad is a light-transmitting material having a light transmittance of 90% or more. The material of the optical pad may be, for example, a high light transmittance material such as polyethylene terephthalate (PET), cyclo olefin polymer (COP), acrylic, or the like.

Figure 4:
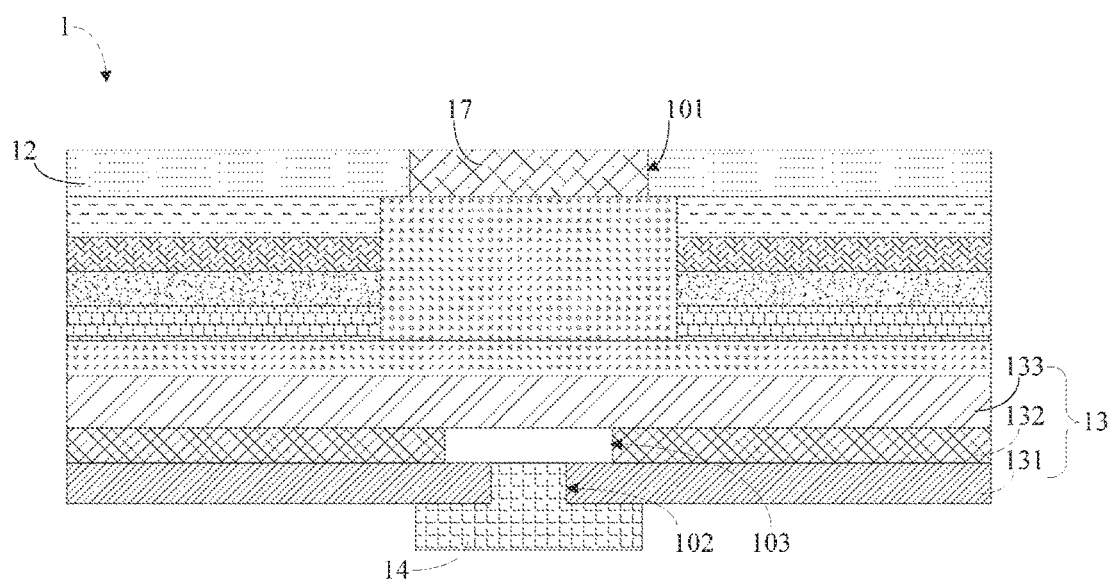
FIG. 4 is a schematic structural diagram of another display module according to an embodiment of the present application.

As an example, FIG. 4 shows a schematic cross-sectional view of another display module. On the basis of the display module shown in FIG. 2, the display module 1 further includes an optical pad 17 adapted to be disposed in the first through hole 101, and a side of the optical pad 17 away from the display panel is aligned with the side of the optical film 12 away from the display panel.

Figure 5:
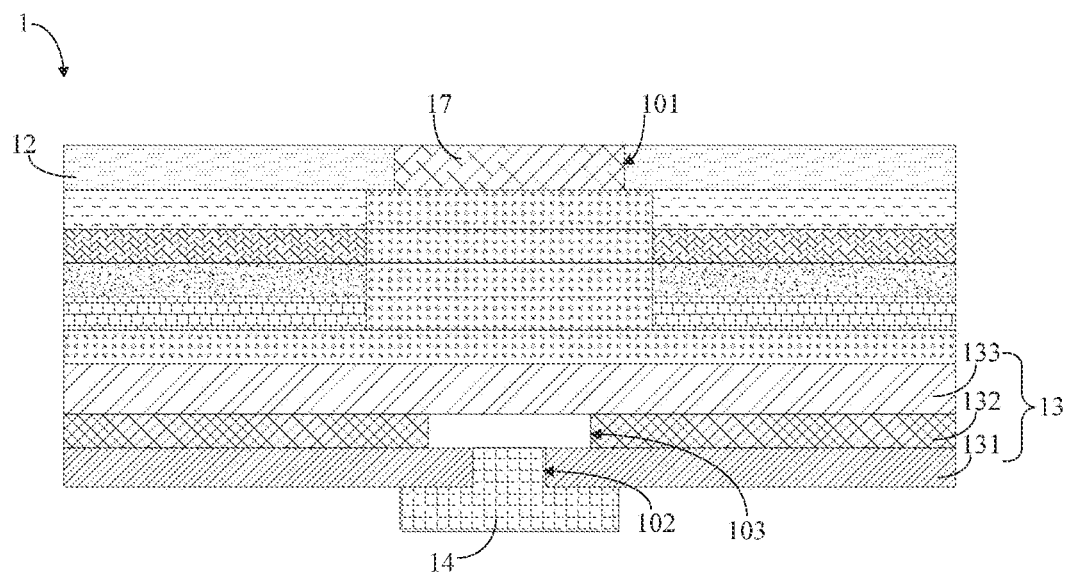
FIG. 5 is a schematic structural diagram of another display module according to an embodiment of the present application.

As an example, FIG. 5 shows a schematic cross-sectional view of another display module. On the basis of the display module shown in FIG. 3, the display module 1 further includes an optical pad 17 adapted to be disposed in the first through hole 101, and a side of the optical pad 17 away from the display panel is aligned with the side of the optical film 12 away from the display panel.

In some embodiments of the present application, continuing to refer to FIGS. 2 to 5, the functional layer 13 further includes a heat dissipation buffer (super clean foam, SCF) layer 132 disposed between the non-light-emitting side of the display panel 11 and the photosensitive element mounting layer 131, and the SCF layer 132 has the function of buffering and dissipating heat. The SCF layer may be a common structure in the art. For example, the SCF layer 132 includes an adhesive layer, a foam layer, an organic material layer, and a metal layer arranged in sequence. The adhesive layer is close to the non-light-emitting side of the display panel 11, an example of the material of the adhesive layer is network adhesive (Embo); the foam layer has the function of light shielding and buffering, and an example of the material of the foam layer is foam; the organic material layer has a reinforcing effect to improve the reliability of the SCF layer 132, and an example of the material of the organic material layer is polyimide; the metal layer has a heat dissipation effect, and an example of the material of the metal layer is copper foil.

In order to allow ambient light to pass through the SCF layer to reach the photosensitive element mounting layer 131 so as to be captured by the photosensitive element 14 mounted on the photosensitive element mounting layer 131, a third through hole 103 is provided in the SCF layer 132, the position of the third through hole 103 corresponds to the first through hole 101 and the second through hole 102, and the forward projection of the second through hole 102 on the display panel 11 falls into the forward projection of the third through hole 103 on the display panel 11 so as to sufficiently capture the ambient light transmitted from the first through hole 101.

In some embodiments of the present application, the diameter of the third through hole 103 is greater than the diameter of the second through hole 102, and the difference between the diameter of the third through hole 103 and the diameter of the second through hole 102 is 0.6 mm or more. Under the premise of ensuring that the photosensitive element 14 fully captures the ambient light transmitted from the first through hole 101, light leakage is avoided, and interference with the photosensitive element 14 is prevented.

In order to further increase the light-capturing efficiency of the photosensitive element 14, in other embodiments of the present application, a fourth through hole is provided on the support layer 133, the position of the fourth through hole corresponds to the first through hole 101 and the second through hole 102, and the forward projection of the second through hole 102 on the display panel 11 falls into the forward projection of the fourth through hole on the display panel 11. The material of the support layer 133 includes, but is not limited to, a high light transmittance material. For example, the material of the support layer 133 may be an inorganic material such as glass, metal, or the like, and the material of the support layer 133 may be an organic material such as rigid plastic.

Further, the diameter of the fourth through hole 104 is greater than the diameter of the second through hole 102, and the difference between the diameter of the fourth through hole 104 and the diameter of the second through hole 102 is 0.2 mm or more. Under the premise of ensuring that the photosensitive element 14 fully captures the ambient light transmitted from the first through hole 101, light leakage is avoided, and interference with the photosensitive element 14 is prevented.

Figure 6:
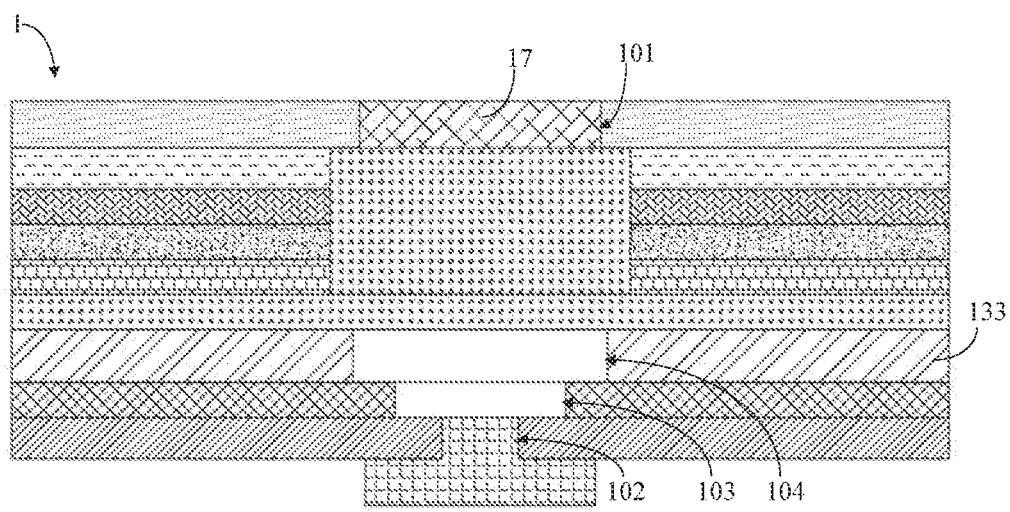
FIG. 6 is a schematic structural diagram of another display module according to an embodiment of the present application.

As an example, FIG. 6 shows a schematic cross-sectional view of another display module, which differs only from the display module shown in FIG. 4 in that: the support layer 133 is provided with a fourth through hole 104, the position of the fourth through hole 104 corresponds to the first through hole 101, the second through hole 102 and the third through hole 103, and the forward projection of the second through hole 102 on the display panel 11 falls into the forward projection of the fourth through hole 104 on the display panel 11.

Figure 7:
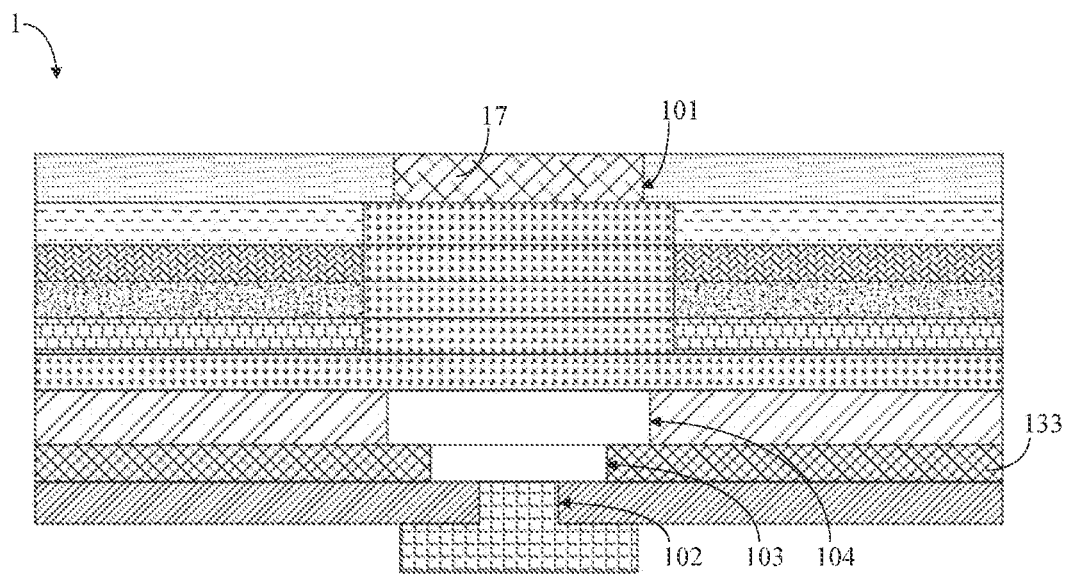
FIG. 7 is a schematic structural diagram of another display module according to an embodiment of the present application.

As an example, FIG. 7 shows a schematic cross-sectional view of another display module. The display module shown in FIG. 7 differs only from the display module shown in FIG. 5 in that: the support layer 133 is provided with a fourth through hole 104, the position of the fourth through hole 104 corresponds to the first through hole 101, the second through hole 102 and the third through hole 103, and the forward projection of the second through hole 102 on the display panel 11 falls into the forward projection of the fourth through hole 104 on the display panel 11.

In some embodiments of the present application, the display module 1 further includes an optical clear adhesive (OCA) layer disposed on at least one side of the optical film 12, for example, the optical clear adhesive layer disposed on a side of the optical film 12 away from the display panel 11.

Further, the display module 1 further includes a cover plate (cover window (CW)) disposed on a side of the optical clear adhesive layer away from the display panel 11. The cover plate is used to prevent water, oxygen or impurities in the external environment from entering the inside of the display module, and is typically a glass or transparent organic rigid substrate.

It may be understood that the cover plate includes an ink layer (not shown in the drawings), the ink layer functions to shield other layer structures except for the photosensitive element (e.g., a camera), the photosensitive element is exposed by the ink layer, the size of the ink layer is not specifically limited, and only the conditions under which the photosensitive element (e.g., a camera) can be exposed from the ink layer and the other layer structures are shielded need to be satisfied. For example, when there are the first through hole 101, the second through hole 102, the third through hole 103, and the fourth through hole 104 at the same time, where the aperture of the first through hole 101 is smallest, the ink layer needs to be capable of shielding the optical film 12 and the hole edge of the first through hole 101, and the first through hole 101 cannot be covered to ensure that the photosensitive element such as a camera is exposed from the ink layer, and shields the optical film 12, the SCF layer 132, and the support layer 133. In some embodiments of the present application, the optical clear adhesive layer has a continuous structure, that is, the optical clear adhesive layer is not provided with a through hole through the entire optical clear adhesive layer, so that the optical clear adhesive layer has no hollowed-out region, and the material of the optical clear adhesive layer is an optical clear adhesive material having a low modulus, good fluidity, and a light transmittance of 90% or more. Since no holes are formed in the optical clear adhesive layer, the risk of "gourd screen" phenomenon is further reduced.

Figure 8:
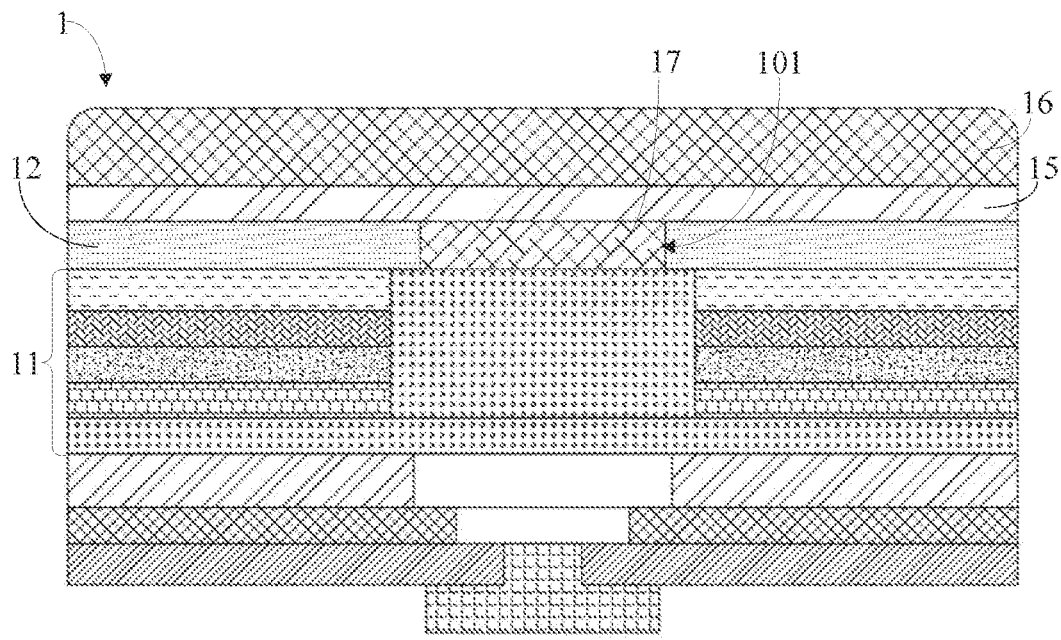
FIG. 8 is a schematic structural diagram of another display module according to an embodiment of the present application.

As an example, FIG. 8 shows a schematic cross-sectional view of another display module. On the basis of the display module shown in FIG. 6, the display module 1 shown in FIG. 8 further includes an optical clear adhesive layer 15 and a cover plate 16, the optical clear adhesive layer 15 is disposed on a side of the optical film 12 away from the display panel 11, the cover plate 16 is disposed on a side of the optical clear adhesive layer 15 away from the optical film 12, and a cover plate 16 completely shields an edge of the optical film 12. The optical clear adhesive layer 15 has a continuous structure, the material of the optical clear adhesive layer 15 is a commercially available OCA material from 3M Corporation, and the modulus of the OCA material is less than 0.25 Mpa. The material of the cover plate 16 is glass.

Figure 9:
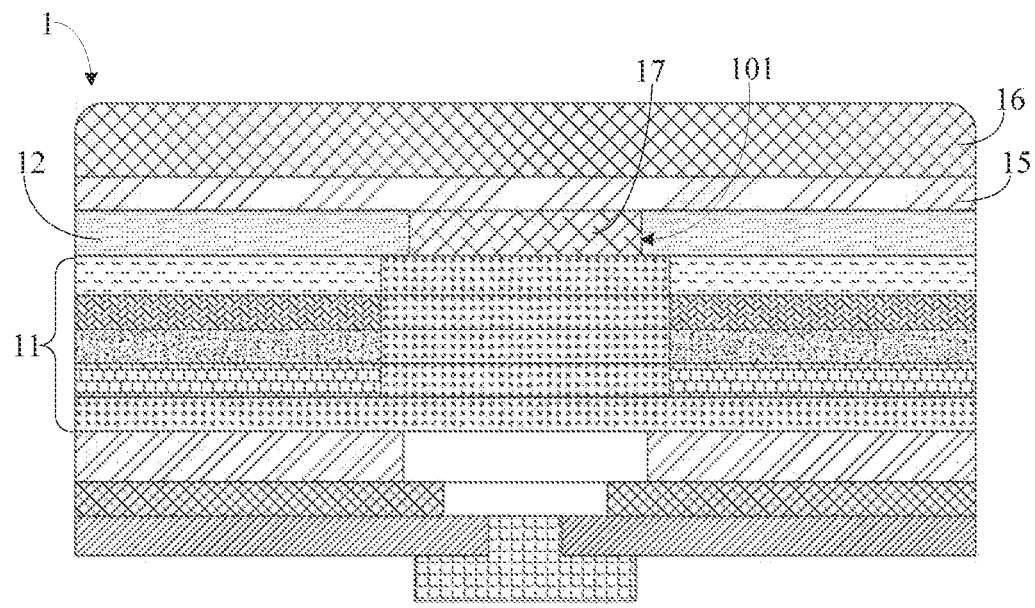
FIG. 9 is a schematic structural diagram of another display module according to an embodiment of the present application.

As an example, FIG. 9 shows a schematic cross-sectional view of another display module. On the basis of the display module shown in FIG. 7, the display module 1 shown in FIG. 9 further includes an optical clear adhesive layer 15 and a cover plate 16, the optical clear adhesive layer 15 is disposed on a side of the optical film 12 away from the display panel 11, the cover plate 16 is disposed on a side of the optical clear adhesive layer 15 away from the optical film 12, and the cover plate 16 completely shields an edge of the optical film 12. The optical clear adhesive layer 15 has a continuous structure, the material of the optical clear adhesive layer 15 is a commercially available OCA material from 3M Corporation, and the modulus of the OCA material is less than 0.25 Mpa. The material of the cover plate 16 is glass.

In order to further improve the light-capturing rate of the photosensitive element 14, in other embodiments of the present application, a fifth through hole 105 is provided in the optical clear adhesive layer 15, the position of the fifth through hole 105 corresponds to the first through hole 101 and the second through hole 102, and the forward projection of the second through hole 102 on the display panel 11 falls into the forward projection of the fifth through hole 105 on the display panel 11. The material of the optical clear adhesive layer 15 is not specifically limited.

Figure 10:
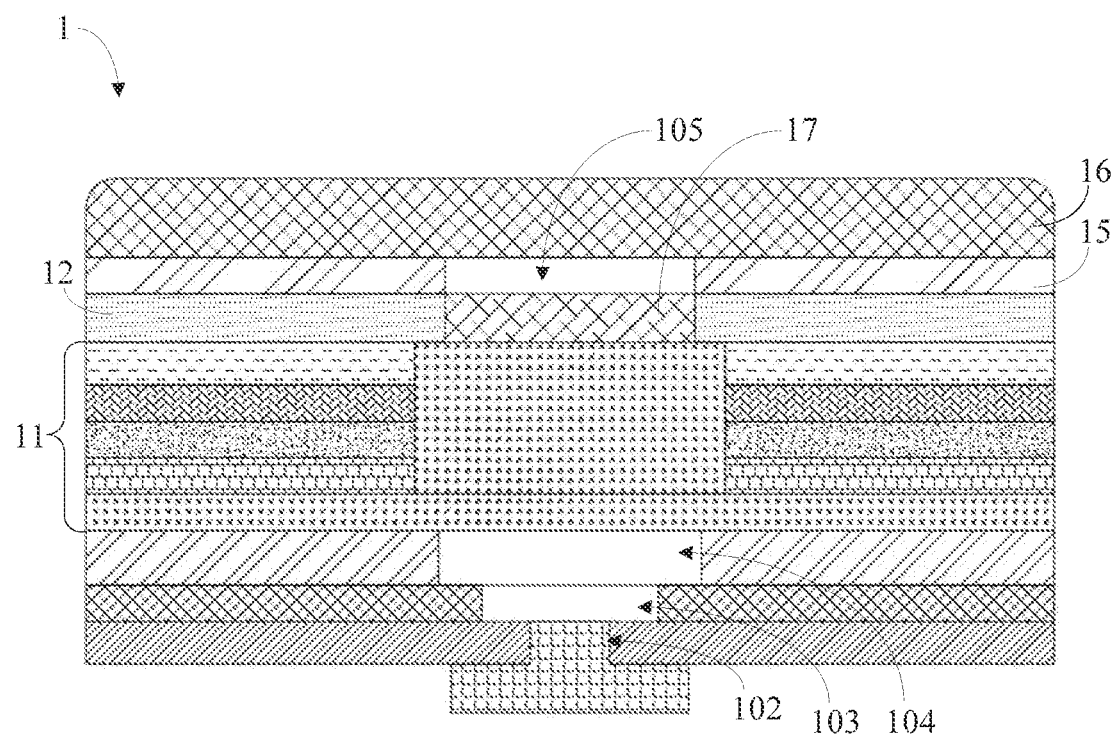
FIG. 10 is a schematic structural diagram of another display module according to an embodiment of the present application.

As an example, FIG. 10 shows a schematic cross-sectional view of another display module. On the basis of the display module shown in FIG. 6, the display module 1 shown in FIG. 10 further includes an optical clear adhesive layer 15 and a cover plate 16, the optical clear adhesive layer 15 is disposed on a side of the optical film 12 away from the display panel 11, the cover plate 16 is disposed on a side of the optical clear adhesive layer 15 away from the optical film 12, and the cover plate 16 completely shields an edge of the optical film 12.

The optical clear adhesive layer 15 is provided with a fifth through hole 105, the position of the fifth through hole 105 corresponds to the first through hole 101, the second through hole 102, the third through hole 103 and the fourth through hole 104, and the forward projection of the second through hole 102 on the display panel 11 falls into the forward projection of the fifth through hole 105 on the display panel 11.

Figure 11:
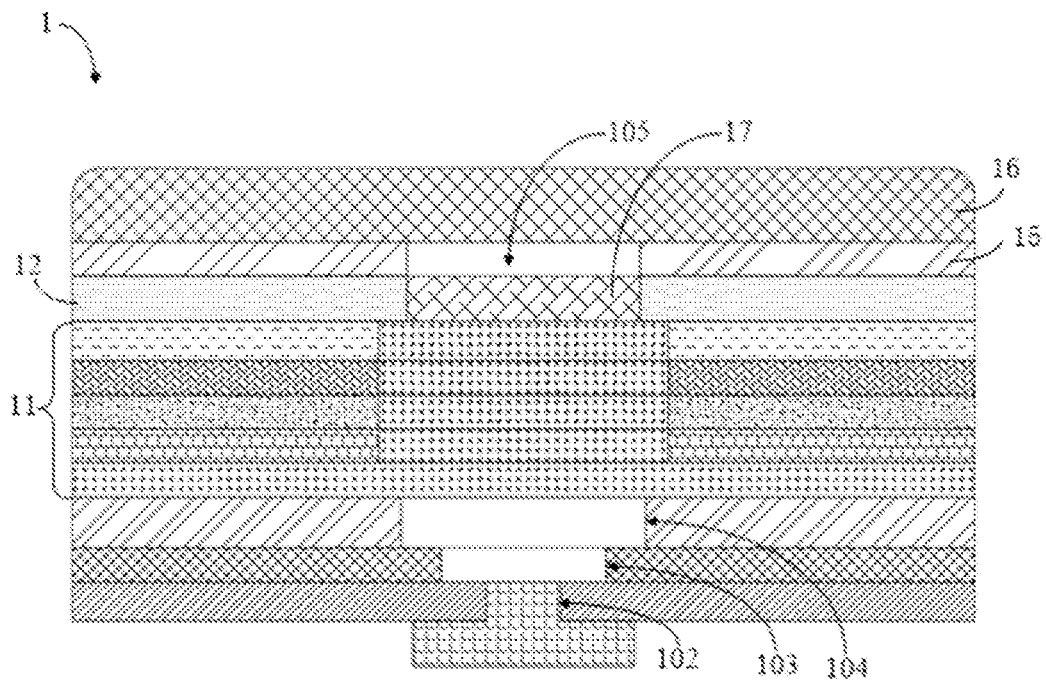
FIG. 11 is a schematic structural diagram of another display module according to an embodiment of the present application.

As an example, FIG. 11 shows a schematic cross-sectional view of another display module. On the basis of the display module shown in FIG. 7, the display module 1 shown in FIG. 11 further includes an optical clear adhesive layer 15 and a cover plate 16, the optical clear adhesive layer 15 is disposed on a side of the optical film 12 away from the display panel 11, the cover plate 16 is disposed on a side of the optical clear adhesive layer 15 away from the optical film 12, and the cover plate 16 completely shields an edge of the optical film 12.

The optical clear adhesive layer 15 is provided with a fifth through hole 105, the position of the fifth through hole 105 corresponds to the first through hole 101, the second through hole 102, the third through hole 103 and the fourth through hole 104, and the forward projection of the second through hole 102 on the display panel 11 falls into the forward projection of the fifth through hole 105 on the display panel 11.

Figure 12:
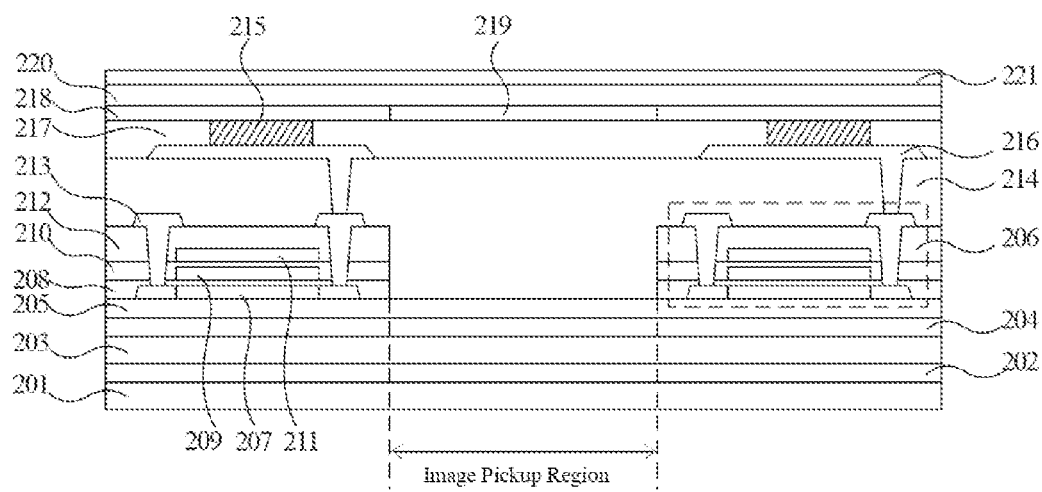
FIG. 12 is a diagram of stacked functional films of a display module according to an embodiment of the present application.

Referring to FIG. 12, stacked structural view of a specific functional films of a display module is provided according to the present invention, and includes an image pickup region and a display region outside the image pickup region, a film layer in a film thickness direction corresponding to the image pickup region is a light-transmitting non-display region. In the light-transmitting non-display region, some of the film layers which are originally made of light-transmitting material are not subjected to special light-transmitting treatment. On the contrary, a film layer which has a non-light-transmitting material or a non-light-transmitting pattern corresponding to this region is subjected to light-transmitting treatment, such as designing the non-light-transmitting pattern away from this region, or filling this region with the light-transmitting material.

Specifically, the aforementioned stacked structural view of a specific functional films includes a flexible substrate, the flexible substrate includes a first flexible layer 201, a barrier layer 202 over the first flexible layer 201, and a second flexible layer 203 over the barrier layer 202; an array substrate is disposed over the flexible substrate, the array substrate includes a buffer layer 204, a base layer 205 disposed over the buffer layer 204, and TFT devices 206 disposed over the base layer 205, the TFT device 206 includes an active layer 207 disposed over the base layer 205, a first gate insulating layer 208 covering the active layer 207, a first gate electrode 209 disposed over the first gate insulating layer 208, a second gate insulating layer 210 disposed over the first gate insulating layer 208 and covering the first gate electrode 209, a second gate electrode 211 disposed over the second gate insulating layer 210, a dielectric layer 212 covering the second gate electrode 211, and source/drain electrodes 213 disposed over the dielectric layer 212, the source/drain electrodes 213 are connected to the active layer 207, the TFT device 206 is disposed away from the light-transmitting non-display region (image pickup region), and a portion of the TFT device 206 layer corresponding to the light-transmitting non-display region is filled with a light-transmitting material; a first planarizing layer 214 is further disposed over the layer of the TFT device 206, a light emitting device 215 and an anode 216 connected to the light emitting device 215 are disposed over the first planarizing layer 214, an opposite end of the anode 216 is connected to the source/drain electrode 213, the light emitting device 215 is disposed away from the light-transmitting non-display region, a second planarizing layer 217 is disposed over the first planarizing layer 214, a cathode layer 218 is disposed over the second planarizing layer 217, the cathode layer 218 is electrically connected to the light emitting device 215, and a portion of the cathode layer 218 corresponding to the light-transmitting non-display region is disposed as a transparent cathode 219; an encapsulation layer 220 and a touch layer 221 over the encapsulation layer 220 are also provided over the cathode layer 218.

An embodiment of the present application further provides a manufacturing method of a display module, which can be used to manufacture a display module shown in FIG. 3, a display module shown in FIG. 5, a display module shown in FIG. 7, a display module shown in FIG. 9, and a display panel shown in FIG. 11. As shown in FIG. 13, the manufacturing method of the display module includes the following steps:

S1: providing a display panel including a substrate and a plurality of film layers stacked on the substrate, each of the plurality of film layers is provided with a light-transmitting non-display region, and positions of the light-transmitting non-display regions of the respective film layers correspond to each other;

S2: forming an optical film on a light-emitting side of the display panel, and forming a first through hole in the optical film, a position of the first through hole corresponds to the light-transmitting non-display region, and a forward projection of the first through hole on the display panel falls within a range of the light-transmitting non-display region;

S3: forming a functional layer including a photosensitive element mounting layer on a non-light-emitting side of a display panel, and forming a second through hole in the photosensitive element mounting layer, a position of the second through hole corresponds to the first through hole, and a forward projection of the second through hole on the display panel falls within a range of the forward projection of the first through hole on the display panel;

S4: providing a photosensitive element, and mounting the photosensitive element to the second through hole.

As for the manufacturing method described above, it should be noted that the manufacturing method of the light-transmitting non-display region of each film layer in the display panel may be a method of a photolithography process combined with a process of filling a light-transmitting material, that is, performing the steps of coating photoresist, exposing and developing, etching to form hollowed-out regions, filling light-transmitting materials, etc., on each film layer in the display panel one by one, if the material of the film layer itself has a high light transmittance (for example, ITO electrodes); or when each functional film layer is separately formed, a light-transmitting non-display region is defined on each functional film layer in advance, and the non-light-transmitting functional patterns on corresponding functional films are disposed away from the light-transmitting non-display region, only the light-transmitting material on the corresponding functional film layer is retained in the light-transmitting non-display region, and the light-transmitting non-display regions of respective functional film layers are stacked to form the light-transmitting non-display region of the display module; the foregoing two layer-by-layer processing methods make it unnecessary to form a light-transmitting non-display region after the display module is prepared.

The operation of "forming an optical film on the light-emitting side of the display panel, and forming a first through hole in the optical film" in step S2, and the operations of "forming a functional layer on the non-light-emitting side of the display panel, the functional layer includes a photosensitive element mounting layer and a second through hole is formed in the photosensitive element mounting layer" in step S3 may be carried out in an interchangeable order.

In some embodiments of the present application, in step S2, the first through hole may be formed in the optical film by a laser cutting process, and in step S3, the second through hole may be formed in the photosensitive element mounting layer by a laser cutting process.

In some embodiments of the present application, in step S2, the first through hole may be formed in the optical film using an etching process, and in step S3, the second through hole may be formed in the photosensitive element mounting layer using an etching process.

In the manufacturing method of the conventional display module, the display panel, the optical film and the functional layer are assembled integrally, and then the display panel, the optical film and the functional layer are integrally cut to form a through hole. The integration cutting involves a large number of film layers, and a large number of regions are affected by the cutting, thus, a cutting crack is easily generated. The edge crack generated by the cutting may extend to the display region, resulting in a problem of poor display and a "gourd screen" phenomenon. In the manufacturing method of the embodiment of the present application, before the display panel is assembled into the display module, each film layer in the display panel has been prepared to form a light-transmitting non-display region, so that there is no need to perform hole processing on the display panel, and only the optical film and the photosensitive element mounting layer need to be performed the hole processing respectively, thereby greatly reducing the risk of cracking and effectively improving the "gourd screen" phenomenon.

An embodiment of the present application further provides a manufacturing method of a display module, which can be used to prepare the display module shown in FIG. 2, the display module shown in FIG. 4, the display module shown in FIG. 6, the display module shown in FIG. 8, and the display panel shown in FIG. 10. As shown in FIG. 14, the manufacturing method of the display module includes the following steps:

S10: providing a stacked structure including a substrate and a plurality of film layers stacked on the substrate, each of the plurality of film layers is predefined with a light-transmitting non-display region, and positions of the predefined light-transmitting non-display regions of respective film layers correspond to each other;

S20: using an etching process to remove a film material in a predefined light-transmitting non-display region in each of the film layers to obtain a stacked structure having a hollowed-out region;

S30: filling the hollowed-out region in the step S20 with a light-transmitting material having a light transmittance of 90% or more, and then drying to obtain a display panel;

S40: forming an optical film on a light-emitting side of a display panel filled with the light-transmitting material, and forming a first through hole in the optical film, a position of the first through hole corresponds to the light-transmitting non-display region, and a forward projection of the first through hole on the display panel falls within a range of the light-transmitting non-display region;

S50: forming a functional layer including a photosensitive element mounting layer on the non-light-emitting side of a display panel filled with a light-transmitting material, and forming a second through hole in the photosensitive element mounting layer, a position of the second through hole corresponds to the first through hole, and the forward projection of the second through hole on the display panel falls within a range of the forward projection of the first through hole on the display panel;

S60: providing a photosensitive element, and mounting the photosensitive element to the second through hole.

It should be noted that the light-transmitting non-display regions of the respective film layers in the display panel are integrally formed, that is, the light-transmitting non-display regions predefined in the respective film layers are integrally etched to form hollowed-out regions, and then the hollowed-out regions are integrally filled with the light-transmitting material, so that the light-transmitting non-display regions of the respective film layers in the display panel are integrated structure. Compared with the manufacturing method shown in FIG. 13, the manufacturing process is simple.

The operation of "forming an optical film on a light-emitting side of a display panel, and forming a first through hole in the optical film" in step S40 and the operation of "forming a functional layer on the non-light-emitting side of a display panel, the functional layer comprises a photosensitive element mounting layer, and forming a second through hole in the photosensitive element mounting layer" in step S50 may be carried out in an interchangeable order.

In some embodiments of the present application, in step S40, the first through hole may be formed in the optical film using a laser cutting process, and in step S50, the second through hole may be formed in the photosensitive element mounting layer using a laser cutting process.

In some embodiments of the present application, in step S40, the first through hole may be formed in the optical film by an etching process, and in step S50, the second through hole may be formed in the photosensitive element mounting layer by an etching process.

In the manufacturing method of this embodiment, although a process of forming holes is performed on the display panel, the display module is not formed by assembling the display panel having the through hole with the optical film and the functional layer, that is, the through hole of the display panel needs to be filled with a light-transmitting material to form a light-transmitting non-display region before assembling. Compared with the manufacturing method of the conventional display module, the manufacturing method of this embodiment effectively improves the "gourd screen" phenomenon under the premise of ensuring that the photosensitive element fully captures the ambient light.

An embodiment of the present application further provides a display terminal. The display terminal includes any one of the display modules described above or a display module prepared by any one of the manufacturing methods of the display module described above. The display terminal may be an electronic product having a display function such as a smartphone, a tablet computer, a notebook computer, a digital camera, a digital video camera, a smart wearable device, a smart weighing electronic scale, a vehicle display, a television set, an electronic book reader, or the like. Among them, the smart wearable device may be, for example, a smart bracelet, a smart watch, a virtual reality (VR) helmet, etc.

The present invention has been described by the above-described related embodiments, however, the above-described embodiments are merely examples for implementing the present invention. It must be noted that the disclosed embodiments do not limit the scope of the invention. Conversely, modifications and equivalent arrangements included in the spirit and scope of the claims are all included in the scope of the present invention.

What is claimed is:

1. A display module comprising:
a display panel comprising a substrate and an array substrate, an organic light emitting layer, an encapsulation layer, and a touch layer sequentially stacked on the substrate; wherein the array substrate is provided with a first light-transmitting non-display region, and a material of the first light-transmitting non-display region is same as a light-transmitting material in the array substrate; the organic light emitting layer is provided with a second light-transmitting non-display region, a material of the second light-transmitting non-display region is same as a light-transmitting material in the organic light emitting layer; the encapsulation layer is provided with a third light-transmitting non-display region, a material of the third light-transmitting non-display region is same as a material in the encapsulation layer; the touch layer is provided with a fourth light-transmitting non-display region, a material of the fourth light-transmitting non-display region is same as a light-transmitting material in the touch layer;
an optical film disposed on a light-emitting side of the display panel, wherein the optical film is provided with a first through hole, and the first through hole being configured to permit ambient light to enter the display module;
a functional layer disposed on a non-light-emitting side of the display panel, wherein the functional layer comprises a photosensitive element mounting layer, the photosensitive element mounting layer is provided with a second through hole, a position of the second through hole corresponds to the first through hole; and
a photosensitive member mounted to the second through hole,
wherein the display panel has a continuous structure, positions of the first light-transmitting non-display region, the second light-transmitting non-display region, the third light-transmitting non-display region, and the fourth light-transmitting non-display region correspond to each other and correspond to the first through hole and the second through hole, and a forward projection of the first through hole on the display panel falls within ranges of the first light-transmitting non-display region, the second light-transmitting non-display region, the third light-transmitting non-display region, and the fourth light-transmitting non-display region, and a forward projection of the second through hole on the display panel falls within a range of the forward projection of the first through hole on the display panel.

2. The display module according to claim 1, wherein the display module further comprises an optical pad disposed in the first through hole, a side of the optical pad away from the display panel is aligned with a side of the optical film away from the display panel, and a material of the optical pad is a light-transmitting material having a light transmittance greater than or equal to 90% and less than 100%.

3. The display module according to claim 1, wherein the first light-transmitting non-display region comprises a pixel defining layer and a planarizing layer; the second light-transmitting non-display region comprises a stacked structure other than a color filter layer; the fourth light-transmitting non-display region comprises an insulating layer other than a touch wire.

4. The display module according to claim 1, wherein the material of the first light-transmitting non-display region, the material of the second light-transmitting non-display region, the material of the third light-transmitting non-display region, and the material of the fourth light-transmitting non-display region are a same light-transmitting material, and a light transmittance of the same light-transmitting material is greater than or equal to 90% and less than 100%.

5. The display module according to claim 1, wherein the display panel is an organic light emitting diode display panel, and the corresponding optical film is a polarizer.

6. The display module according to claim 1, wherein a diameter of the first through hole is greater than a diameter of the second through hole.

7. The display module according to claim 1, wherein the functional layer further comprises a support layer, the support layer is disposed between a non-light-emitting side of the display panel and the photosensitive element mounting layer; the support layer has a continuous structure, and a material of the support layer is a light-transmitting material having a light transmittance greater than or equal to 90% and less than 100%.

8. The display module according to claim 1, wherein the functional layer further comprises a support layer, the support layer is disposed between a non-light-emitting side of the display panel and the photosensitive element mounting layer; the support layer is provided with a fourth through hole, a position of the fourth through hole corresponds to the first through hole and the second through hole, and the forward projection of the second through hole on the display panel falls within a range of a forward projection of the fourth through hole on the display panel.

9. The display module according to claim 8, wherein a diameter of the fourth through hole is greater than a diameter of the second through hole.

10. The display module according to claim 1, wherein the display module further comprises an optical clear adhesive layer, the optical clear adhesive layer is disposed on at least one side of the optical film, and the optical clear adhesive layer has a continuous structure.

11. The display module according to claim 1, wherein the display module further comprises an optical clear adhesive layer, the optical clear adhesive layer is disposed on at least one side of the optical film, and the optical clear adhesive layer is provided with a fifth through hole, a position of the fifth through hole corresponds to the first through hole and the second through hole, and the forward projection of the second through hole on the display panel falls within a range of a forward projection of the fifth through hole on the display panel.

12. The display module according to claim 11, wherein a diameter of the fifth through hole is greater than a diameter of the second through hole.

13. A display module comprising:
 a display panel comprising a substrate and an array substrate, stacked on the substrate;
 an optical film disposed on a light-emitting side of the display panel, wherein the optical film is provided with a first through hole, and the first through hole being configured to permit ambient light to enter the display module;
 a functional layer disposed on a non-light-emitting side of the display panel, wherein the functional layer comprises a photosensitive element mounting layer, the photosensitive element mounting layer is provided with a second through hole, a position of the second through hole corresponds to the first through hole; and
 a photosensitive member mounted to the second through hole,
 wherein the display panel has a continuous structure, the array substrate is provided with light-transmitting non-display regions, positions of the light-transmitting non-display regions of respective film layers corresponding to each other and corresponding to the first through hole and the second through hole, and a forward projection of the first through hole on the display panel falls within a range of the light-transmitting non-display region, and a forward projection of the second through hole on the display panel falls within a range of the forward projection of the first through hole on the display panel; and
 wherein the functional layer further comprises a heat dissipation buffer layer, the heat dissipation buffer layer is disposed between the non-light-emitting side of the display panel and the photosensitive element mounting layer, the heat dissipation buffer layer is provided with a third through hole, a position of the third through hole corresponds to the first through hole and the second through hole, and the forward projection of the second through hole on the display panel falls within a range of a forward projection of the third through hole on the display panel.

14. The display module according to claim 13, wherein a diameter of the third through hole is greater than a diameter of the second through hole.

15. A manufacturing method of a display module, wherein the manufacturing method of the display module comprises following steps:
 providing a display panel comprising a substrate and an array substrate, an organic light emitting layer, an encapsulation layer, and a touch layer sequentially stacked on the substrate, wherein the array substrate is provided with a first light-transmitting non-display region, and a material of the first light-transmitting non-display region is same as a light-transmitting material in the array substrate; the organic light emitting layer is provided with a second light-transmitting non-display region, a material of the second light-transmitting non-display region is same as a light-transmitting material in the organic light emitting layer; the encapsulation layer is provided with a third light-transmitting non-display region, a material of the third light-transmitting non-display region is same as a material in the encapsulation layer; the touch layer is provided with a fourth light-transmitting non-display region, a material of the fourth light-transmitting non-display region is same as a light-transmitting material in the touch layer;
 forming an optical film on a light-emitting side of the display panel, and forming a first through hole in the optical film, and the first through hole being configured to permit ambient light to enter the display module;
 forming a functional layer on a non-light-emitting side of the display panel, the functional layer comprising a photosensitive element mounting layer, and forming a second through hole in the photosensitive element mounting layer, wherein a position of the second through hole corresponds to the first through hole, and a forward projection of the second through hole on the display panel falls within a range of the forward projection of the first through hole on the display panel; and
 providing a photosensitive element mounted to the second through hole;
 wherein the display panel has a continuous structure, positions of the first light light-transmitting non-display region, the second light-transmitting non-display region, the third light-transmitting non-display region, and the fourth light-transmitting non-display region correspond to each other and correspond to the first through hole and the second through hole, and a forward projection of the first through hole on the display panel falls within ranges of the first light-transmitting non-display region, the second light-transmitting non-display region, the third light-transmitting non-display region, and the fourth light-transmitting non-display region.

16. The manufacturing method according to claim 15, wherein the step of providing the display panel comprises:
 providing a stacked structure comprising the substrate and a preliminary array substrate, a preliminary organic light emitting layer, a preliminary encapsulation layer, and a preliminary touch layer sequentially stacked on the substrate, wherein the preliminary array substrate comprises a preliminary first light-transmitting non-display region, the preliminary organic light emitting layer comprises a preliminary second light-transmitting non-display region, the preliminary encapsulation layer comprises a preliminary third light-transmitting non-display region, and the preliminary touch layer comprises a preliminary fourth light-transmitting non-display region, and positions of the preliminary first light-transmitting non-display region, the preliminary second light-transmitting non-display region, the preliminary third light-transmitting non-display region, and the preliminary fourth light-transmitting non-display region correspond to each other;

removing film materials in the predefined preliminary first light-transmitting non-display region, the preliminary second light-transmitting non-display region, the preliminary third light-transmitting non-display region, and the preliminary fourth light-transmitting non-display region using an etching process to obtain a stacked structure having a hollowed-out region; and filling the hollowed-out region with a light-transmitting material having a light transmittance greater than or equal to 90% and less than 100%, and then drying to obtain the display panel.

17. The manufacturing method according to claim 15, wherein the step of providing the display panel comprises:
wherein the array substrate, the organic light emitting layer, the encapsulation layer, and the touch layer are formed from a preliminary array substrate, a preliminary organic light emitting layer, a preliminary encapsulation layer, and a preliminary touch layer, respectively, the first light-transmitting non-display region is defined in the preliminary array substrate, the second light-transmitting non-display region is defined in the preliminary organic light emitting layer, the third light-transmitting non-display region is defined in the preliminary encapsulation layer, and the fourth light-transmitting non-display region is defined in the preliminary touch layer in advance, and non-light-transmitting functional patterns on the array substrate, the organic light emitting layer, the encapsulation layer, and the touch layer are respectively disposed away from the first light-transmitting non-display region, the second light-transmitting non-display region, the third light-transmitting non-display region, and the fourth light-transmitting non-display region, and a light-transmitting non-display region of the display module is formed by stacking the first light-transmitting non-display region, the second light-transmitting non-display region, the third light-transmitting non-display region, and the fourth light-transmitting non-display region.

18. The manufacturing method according to claim 15, wherein the step of providing the display panel comprises:
wherein the array substrate, the organic light emitting layer, the encapsulation layer, and the touch layer are formed from a preliminary array substrate, a preliminary organic light emitting layer, a preliminary encapsulation layer, and a preliminary touch layer, respectively, wherein the respective first, second, third, and fourth light-transmitting non-display regions are arranged away from non-light-transmitting functional patterns in the preliminary array substrate, the preliminary organic light emitting layer, the preliminary encapsulation layer, and the preliminary touch layer; at least one of the first light-transmitting non-display region of the preliminary array substrate, the second light-transmitting non-display region of the preliminary organic light emitting layer, the third light-transmitting non-display region of the preliminary encapsulation layer, and the fourth light-transmitting non-display region of the preliminary touch layer is formed by forming a hole and filling the hole with the respective light-transmitting material, and a light-transmitting non-display region of the display module is formed by stacking the first light-transmitting non-display region, the second light-transmitting non-display region, the third light-transmitting non-display region, and the fourth light-transmitting non-display region.

* * * * *